(12) United States Patent
Arakida

(10) Patent No.: US 12,719,236 B2
(45) Date of Patent: Aug. 25, 2026

(54) LIGHT EMITTING DEVICE

(71) Applicant: Sony Semiconductor Solutions Corporation, Kanagawa (JP)

(72) Inventor: Takahiro Arakida, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 792 days.

(21) Appl. No.: 17/792,238

(22) PCT Filed: Jan. 26, 2021

(86) PCT No.: PCT/JP2021/002636
§ 371 (c)(1),
(2) Date: Jul. 12, 2022

(87) PCT Pub. No.: WO2021/157431
PCT Pub. Date: Aug. 12, 2021

(65) Prior Publication Data

US 2023/0047126 A1 Feb. 16, 2023

(30) Foreign Application Priority Data

Feb. 7, 2020 (JP) ................................ 2020-019567

(51) Int. Cl.
*H01S 5/183* (2006.01)
*H01S 5/042* (2006.01)
*H01S 5/42* (2006.01)

(52) U.S. Cl.
CPC ...... *H01S 5/18308* (2013.01); *H01S 5/04256* (2019.08); *H01S 5/18305* (2013.01); *H01S 5/423* (2013.01)

(58) Field of Classification Search
CPC ..................................................... H01S 5/1805
See application file for complete search history.

(56) References Cited

U.S. PATENT DOCUMENTS 5,625,202 A 4/1997 Chai
5,656,832 A 8/1997 Ohba
(Continued)

FOREIGN PATENT DOCUMENTS

CN 1292934 A 4/2001
CN 1402395 A 3/2003
(Continued)

OTHER PUBLICATIONS https://web.archive.org/web/20190622074936/https://www.merriam-webster.com/dictionary/on (Year: 2019).*
(Continued)

*Primary Examiner* — Minsun O Harvey
*Assistant Examiner* — Stephen Sutton Kotter
(74) *Attorney, Agent, or Firm* — K&L Gates LLP

(57) ABSTRACT

A light emitting device according to an embodiment of the present disclosure includes: a substrate; a first contact layer; a buffer layer in which at least any of a carrier concentration, a material composition, and a composition ratio is different from that of the first contact layer; and a semiconductor stacked body. The substrate has a first surface and a second surface that are opposed to each other. The first contact layer is stacked on the first surface of the substrate. The buffer layer is stacked on the first contact layer. The semiconductor stacked body is stacked above the first surface of the substrate with the first contact layer and the buffer layer interposed in between. The semiconductor stacked body has a light emitting region configured to emit laser light.

20 Claims, 4 Drawing Sheets

(56) References Cited

U.S. PATENT DOCUMENTS

| | | | | |
|---|---|---|---|---|
| 6,067,309 | A | 5/2000 | Onomura | |
| 6,259,715 | B1 | 7/2001 | Nakayama | |
| 7,193,246 | B1 * | 3/2007 | Tanizawa | B82Y 20/00 257/101 |
| 2006/0214176 | A1 | 9/2006 | Ouchi | |
| 2006/0227835 | A1 * | 10/2006 | Ueki | H01S 5/18341 372/50.124 |
| 2010/0232465 | A1 | 9/2010 | Tsukiji | |
| 2011/0148328 | A1 * | 6/2011 | Joseph | F21K 9/00 315/312 |
| 2017/0070026 | A1 * | 3/2017 | Jogan | H10F 77/306 |
| 2019/0052061 | A1 * | 2/2019 | Kondo | H01S 5/2206 |
| 2019/0090068 | A1 * | 3/2019 | Fishman | H01S 5/0028 |
| 2020/0176952 | A1 | 6/2020 | Nakajima | |
| 2022/0247153 | A1 * | 8/2022 | Maeda | H01S 5/18347 |

FOREIGN PATENT DOCUMENTS

| | | | |
|---|---|---|---|
| CN | 101136538 | A | 3/2008 |
| CN | 101359807 | A | 2/2009 |
| CN | 102136676 | A | 7/2011 |
| CN | 110383486 | A | 10/2019 |
| JP | H05211346 | A | 8/1993 |
| JP | H11214750 | A | 8/1999 |
| JP | H11330554 | A | 11/1999 |
| JP | 2000151025 | A | 5/2000 |
| JP | 2004095838 | A | 3/2004 |
| JP | 2005243900 | A | 9/2005 |
| JP | 2010016172 | A | 1/2010 |
| JP | 2013527484 | A | 6/2013 |
| JP | 2015041627 | A | 3/2015 |
| JP | 2019033210 | A | 2/2019 |
| KR | 980012737 | A | 4/1998 |
| TW | 483205 | B | 4/2002 |
| WO | WO-2018235413 | A1 | 12/2018 |

OTHER PUBLICATIONS

International Search Report issued in International Patent Application No. PCT/JP2021/002636 on Apr. 20, 2021 and English translation of same. 7 pages.

Written Opinion issued in International Patent Application No. PCT/JP2021/002636 on Apr. 20, 2021. 6 pages.

* cited by examiner

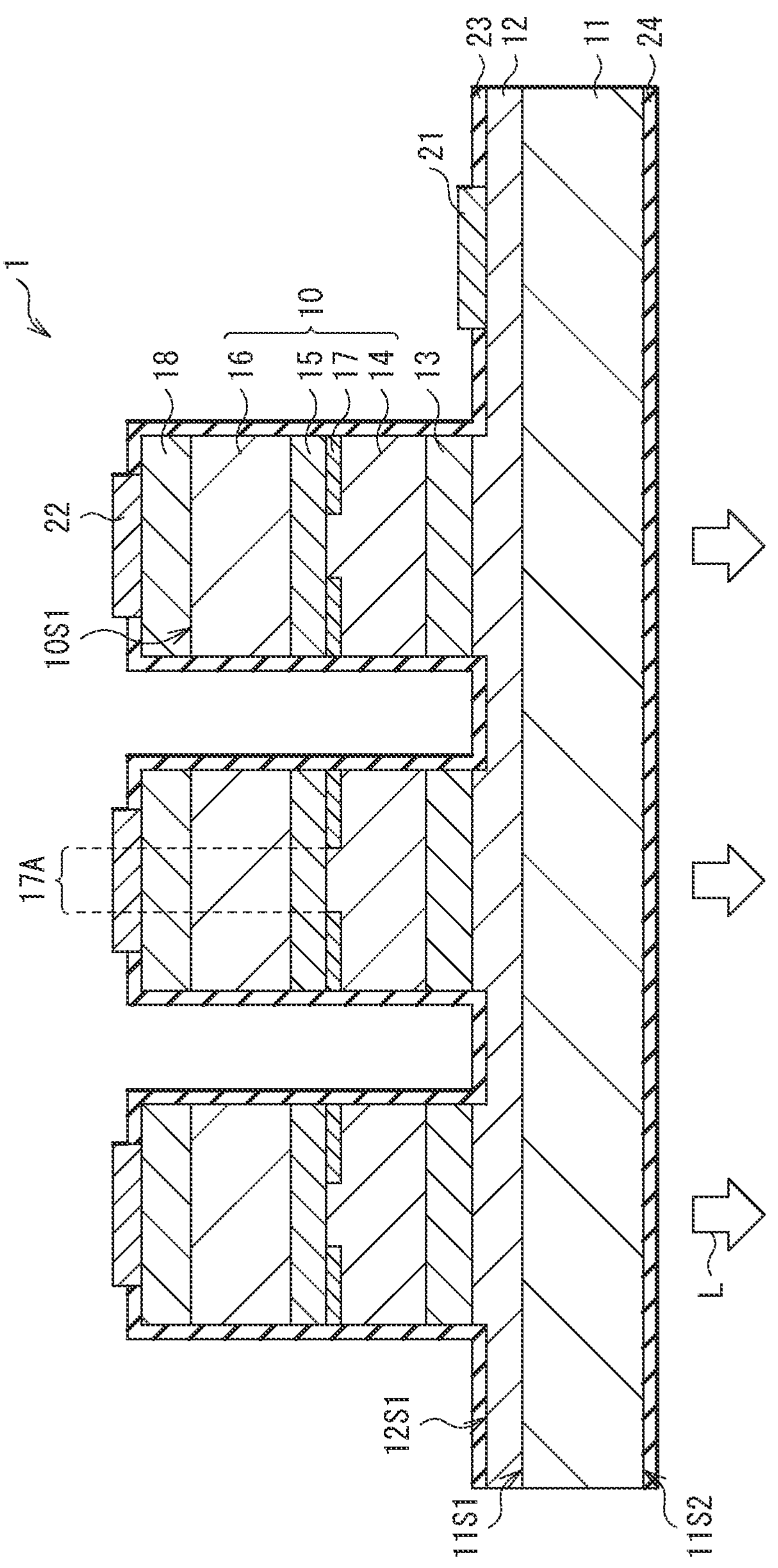
[ FIG. 1 ]
1
10
18
16
15
17
14
13
21
22
10S1
17A
23
12
11
24
L
12S1
11S1
11S2

[ FIG. 2A ]
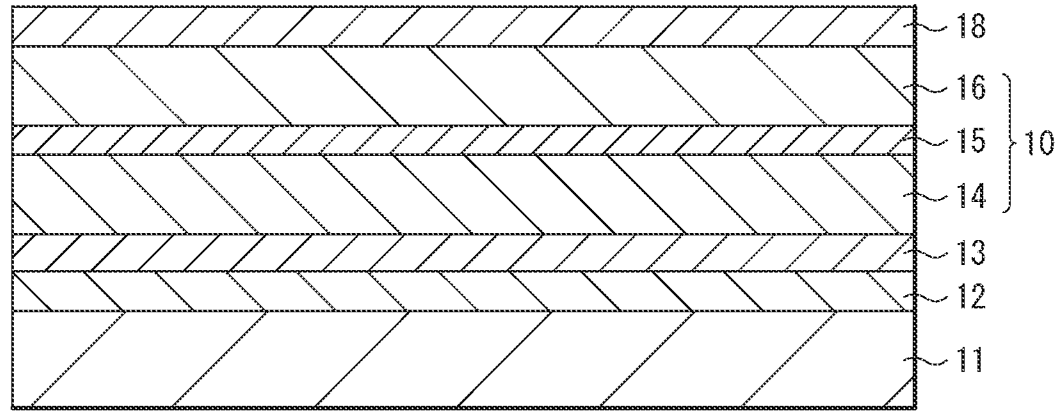
[ FIG. 2B ]
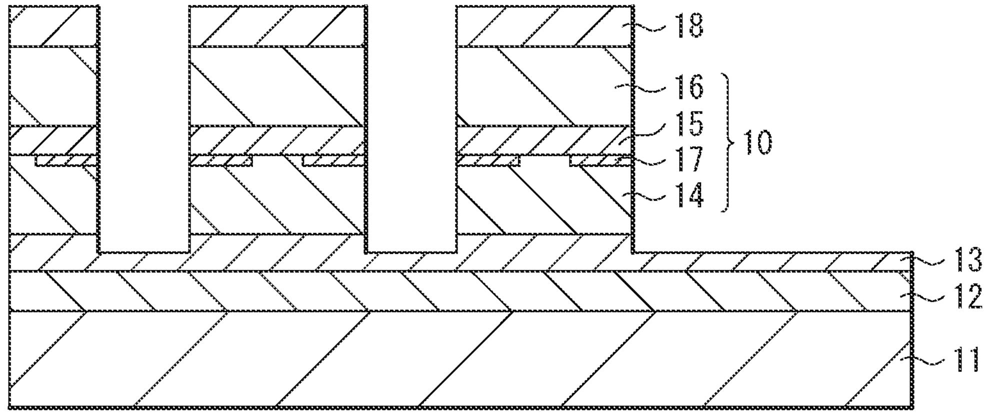

[ FIG. 2C ]
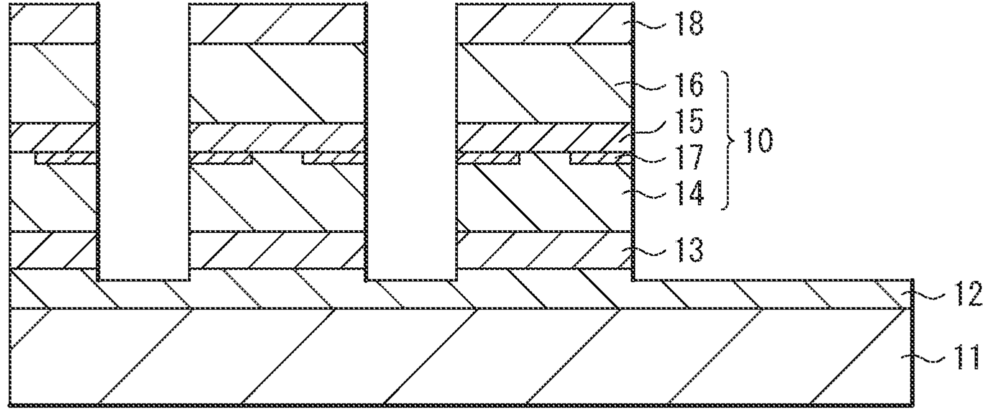
[ FIG. 2D ]
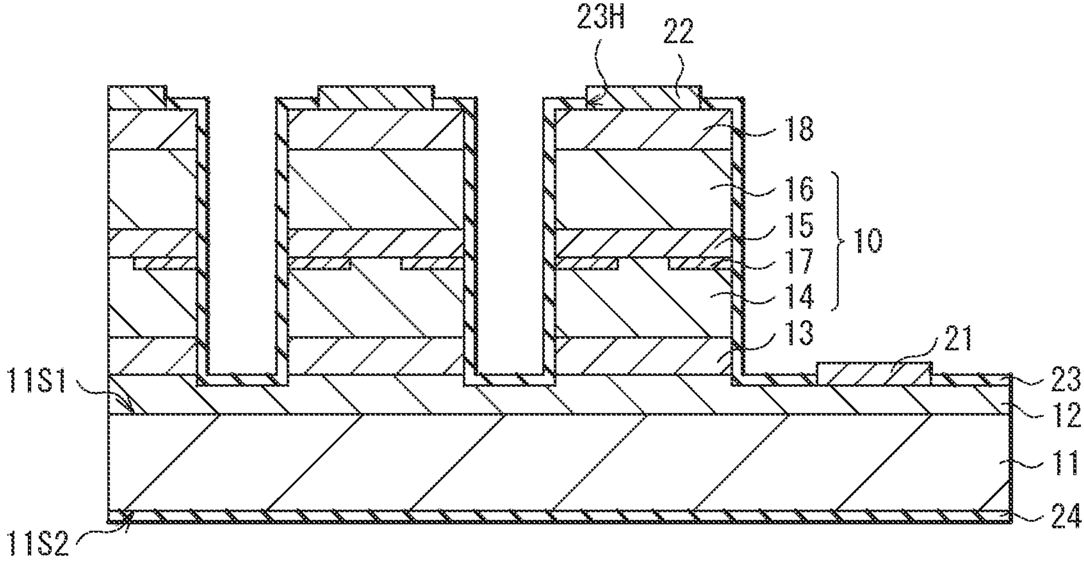

[ FIG. 3 ]
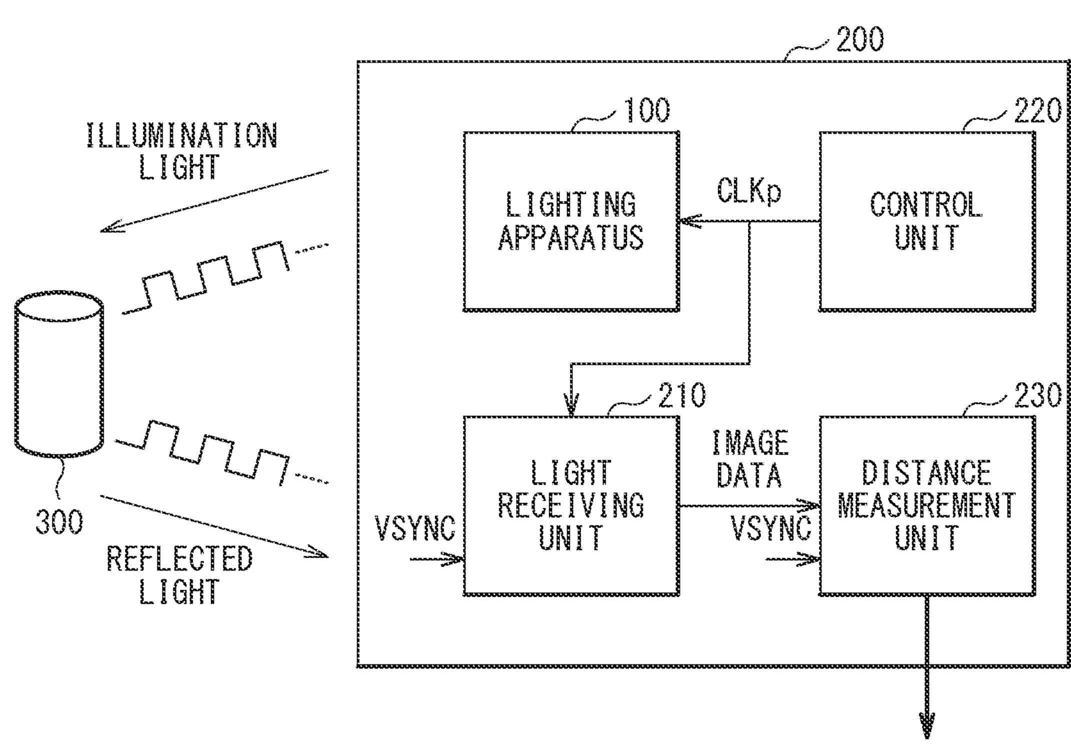

LIGHT EMITTING DEVICE

TECHNICAL FIELD

The present disclosure relates, for example, to a back-emitting light emitting device.

BACKGROUND ART

For example, PTL 1 discloses a surface-type light emitting element in which an n-type semiconductor multilayered film, a substrate-side contact and injection layer and a p-type semiconductor multilayered film, a cavity including a light emitting layer, and an n-type semiconductor multilayered film are formed on an n-type or semi-insulating GaAs substrate in this order. The n-type semiconductor multilayered film is included in a substrate-side mirror. The n-type semiconductor multilayered film is included in an air-side mirror.

CITATION LIST

Patent Literature

PTL 1: Japanese Unexamined Patent Application Publication No. H5-211346

SUMMARY OF THE INVENTION

Incidentally, a light emitting device is requested to have higher reliability.

It is desirable to provide a light emitting device that makes it possible to increase the reliability.

A light emitting device according to an embodiment of the present disclosure includes: a substrate; a first contact layer; a buffer layer in which at least any of a carrier concentration, a material composition, and a composition ratio is different from that of the first contact layer; and a semiconductor stacked body. The substrate has a first surface and a second surface that are opposed to each other. The first contact layer is stacked on the first surface of the substrate. The buffer layer is stacked on the first contact layer. The semiconductor stacked body is stacked above the first surface of the substrate with the first contact layer and the buffer layer interposed in between. The semiconductor stacked body has a light emitting region configured to emit laser light.

In the light emitting device according to the embodiment of the present disclosure, the buffer layer in which at least any of the carrier concentration, the material composition, and the composition ratio is different from that of the first contact layer is provided between the first contact layer and the semiconductor stacked body. This forms the semiconductor stacked body having excellent crystal quality.

BRIEF DESCRIPTION OF DRAWING

FIG. 1 is a cross-sectional schematic diagram illustrating an example of a configuration of a semiconductor laser according to an embodiment of the present disclosure.

FIG. 2A is a cross-sectional schematic diagram describing an example of a method of manufacturing the semiconductor laser illustrated in FIG. 1.

FIG. 2B is a cross-sectional schematic diagram illustrating a step subsequent to FIG. 2A.

FIG. 2C is a cross-sectional schematic diagram illustrating a step subsequent to FIG. 2B.

FIG. 2D is a cross-sectional schematic diagram illustrating a step subsequent to FIG. 2C.

FIG. 3 is a block diagram illustrating an example of a schematic configuration of a distance measurement system in which a lighting apparatus is used that includes the semiconductor laser illustrated in FIG. 1.

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure is not limited to the disposition, dimensions, dimensional ratios, or the like of the respective components illustrated in the drawings. It is to be noted that description is given in the following order.

1. Embodiment (an example of a back-emitting semiconductor laser including, between a first contact layer and a first light reflecting layer, a buffer layer in which any of a carrier concentration, a material composition, and a composition ratio is different from that of the first contact layer)
   - 1-1. Configuration of Semiconductor Laser
   - 1-2. Method of Manufacturing Semiconductor Laser
   - 1-3. Workings and Effects
2. Application Example (an example of a distance measurement system)

1. Embodiment

FIG. 1 schematically illustrates an example of a cross-sectional configuration of a light emitting device (semiconductor laser 1) according to an embodiment of the present disclosure. This semiconductor laser 1 is, for example, back-emitting VCSEL (Vertical Cavity Surface Emitting LASER). For example, a plurality of VCSELs is integrated in an array as a plurality of light emitting regions.

(1-1. Configuration of Semiconductor Laser)

The semiconductor laser 1 includes, for example, a plurality of semiconductor stacked bodies 10 on a first surface (front surface (surface 11S1)) of a substrate 11. Each of the semiconductor stacked bodies 10 has, for example, a columnar shape (mesa shape). For example, a first light reflecting layer 14, an active layer 15, and a second light reflecting layer 16 are stacked in this order. There is provided a current confining layer 17 between the first light reflecting layer 14 and the active layer 15. A current injection region 17A is formed in the current confining layer 17. This semiconductor stacked body 10 corresponds to a specific example of a "semiconductor stacked body" according to the present disclosure. Between the semiconductor stacked body 10 and a substrate 11, a first contact layer 12 and a buffer layer 13 are stacked in order from the substrate side. The buffer layer 13 forms a mesa shape along with the semiconductor stacked body 10. The first contact layer 12 extends on the substrate 11 as a layer common to the plurality of semiconductor stacked bodies 10. There is provided a first electrode 21 on the first contact layer 12 as an electrode common to the respective semiconductor stacked bodies 10. A second contact layer 18 and a second electrode 22 are formed in this order on each of the upper surfaces (surfaces 10S1) of the respective semiconductor stacked bodies 10. Further, the upper surface (surface 12S1) of the first contact layer 12 and the upper surface of the second contact layer 18 except for the first electrode 21 and the second electrode 22 and the side surfaces of the second contact layer 18, the semiconductor stacked body 10, and the buffer layer 13 are covered with an insulating film 23. The second surface (back surface (surface 11S2)) of the substrate 11 is covered with an insulating film 24.

The following describes a configuration, a material, and the like of each section of the semiconductor laser 1 in detail.

The substrate 11 is a support substrate on which the plurality of semiconductor stacked bodies 10 is integrated. The substrate 11 includes a semi-insulating substrate including, for example, a GaAs-based semiconductor including, for example, no impurities. In addition, the substrate 11 is not necessarily limited to a typical semi-insulating substrate as long as the substrate 11 is low in carrier concentration and absorbs less laser light. For example, it is possible to use a substrate having a p-type or n-type carrier concentration of $5\times10^{17}$ $cm^{-3}$ or less as the substrate 11.

The first contact layer 12 includes, for example, a GaAs-based semiconductor having electrical conductivity. The first contact layer 12 is for electrically coupling the first electrode 21 and the first light reflecting layer 14 of each of the semiconductor stacked bodies 10. The first contact layer 12 includes p-type GaAs having, for example, a carrier concentration of $1\times10^{19}$ $cm^{-3}$ or more. The first contact layer 12 corresponds to a specific example of a "first contact layer" according to the present disclosure. The film thickness of the first contact layer in the stack direction is, for example, 200 nm or more and 1500 nm or less.

The buffer layer 13 is for recovering the crystal quality of the semiconductor stacked body 10 formed above the first contact layer 12. It is preferable that the buffer layer 13 have a configuration as follows. For example, the buffer layer 13 is formed to have a carrier concentration different from that of the first contact layer 12. Specifically, the buffer layer 13 includes p-type GaAs having a carrier concentration lower than that of the first contact layer 12. The carrier concentration is, for example, less than $1\times10^{19}$ $cm^{-3}$. Preferably, the carrier concentration is $5\times10^{18}$ $cm^{-3}$ or less. For example, the buffer layer 13 includes a semiconductor having a different material composition and composition ratio from those of the first contact layer 12 (e.g., GaAs layer). Examples of materials included in the buffer layer 13 include AlAs, AlGaAs, InGaAs, AlGaInAs, GaInP, and AlGaInP. It is possible to form the buffer layer 13 as a single layer film or a stacked film including a layer including any of the semiconductor materials described above.

The buffer layer 13 includes at least any of those described above. The buffer layer 13 hereby alleviates the deterioration of the crystallizability of the first contact layer 12 caused by the high-concentration doping and recovers the crystal quality of the semiconductor stacked body 10 formed above the first contact layer 12. The film thickness of the buffer layer 13 in the stack direction is, for example, 100 nm or more and 1000 nm or less.

The first light reflecting layer 14 is disposed between the buffer layer 13 and the current confining layer 17. The first light reflecting layer 14 is opposed to the second light reflecting layer 16 with the active layer 15 and the current confining layer 17 interposed in between. The first light reflecting layer 14 resonates the light generated in the active layer 15 between the first light reflecting layer 14 and the second light reflecting layer 16. The first light reflecting layer 14 corresponds to a specific example of a "first light reflecting layer" according to the present disclosure.

The first light reflecting layer 14 is a DBR (Distributed Bragg Reflector) layer in which low refractive index layers (not illustrated) and high refractive index layers (not illustrated) are alternately stacked. Each of the low refractive index layers includes, for example, p-type $Al_{x1}Ga_{1-x1}As$ ($0<x1\leq1$) having an optical film thickness of $\lambda\times1/4n$ and each of the high refractive index layers includes, for example, p-type $Al_{x2}Ga_{1-x2}As$ ($0\leq x2<x1$) having an optical film thickness of $\lambda\times1/4n$. $\lambda$ represents the oscillation wavelength of laser light emitted from each of the light emitting regions and n represents the refractive index.

The active layer 15 is provided between the first light reflecting layer 14 and the second light reflecting layer 16. The active layer 15 includes, for example, an aluminum-gallium-arsenide (AlGaAs)-based semiconductor material. In the active layer 15, the holes and electrons injected from the first electrode 21 and a second electrode 22 undergo radiative recombination to generate stimulated emission light. The region of the active layer 15 opposed to the current injection region 17A serves as a light emitting region. For example, undoped $Al_{x3}Ga_{1-x3}As$ ($0<x3\leq0.45$) is usable for the active layer 15. The active layer 15 may have a multi quantum well (MQW: Multi Quantum Well) structure of GaAs and AlGaAs, for example. It is sufficient if a material included in the active layer 15 is selected in accordance with the desired wavelength region of laser light. The active layer 15 may have a multi quantum well structure of indium gallium arsenide (InGaAs) and AlGaAs, for example, in a case where laser characteristics in a 900-nm band are obtained. The active layer 15 corresponds to a specific example of an "active layer" according to the present disclosure.

The second light reflecting layer 16 is a DBR layer disposed between the active layer 15 and the second contact layer 18. The second light reflecting layer 16 is opposed to the first light reflecting layer 14 with the active layer 15 and the current confining layer 17 interposed in between. The second light reflecting layer 16 corresponds to a specific example of a "second light reflecting layer" according to the present disclosure.

The second light reflecting layer 16 has a stacked structure in which low refractive index layers and high refractive index layers are alternately superimposed. A low refractive index layer is n-type $Al_{x4}Ga_{1-x4}As$ ($0<x4\leq1$) having, for example, an optical film thickness of $\lambda/4n$. A high refractive index layer is n-type $Al_{x5}Ga_{1-x5}As$ ($0<x5<x4$) having, for example, an optical film thickness of $\lambda/4n$.

The current confining layer 17 is provided between the first light reflecting layer 14 and the active layer 15. The current confining layer 17 is formed to have an annular shape having a predetermined width from the outer periphery side to the inner side of the semiconductor stacked body 10 having, for example, a mesa shape. In other words, the current confining layer 17 is provided between the first light reflecting layer 14 and the active layer 15. The current confining layer 17 has an opening having a predetermined width at the middle portion thereof. This opening serves as the current injection region 17A. The current confining layer 17 includes, for example, p-type AlGaAs. Specifically, the current confining layer 17 includes $Al_{0.85}Ga_{0.15}As$ to AlAs. This is oxidized as an aluminum oxide ($AlO_x$) layer to confine currents. Providing the semiconductor laser 1 with this current confining layer 17 confines currents injected into the active layer 15 from the first electrode 21 and increases the current injection efficiency.

The second contact layer 18 includes, for example, a GaAs-based semiconductor having electrical conductivity. The second contact layer 18 includes, for example, n-type GaAs. The second contact layer 18 corresponds to a specific example of a "second contact layer" according to the present disclosure.

The first electrode 21 is provided on the first contact layer 12. The first electrode 21 is formed by using, for example, a multilayered film of titanium (Ti)/platinum (Pt)/gold (Au).

The second electrode 22 is provided above the semiconductor stacked body 10. Specifically, the second electrode 22 is provided on the second contact layer 18. The second electrode 22 is formed by using, for example, a multilayered film of gold-germanium (Au—Ge)/nickel (Ni)/gold (Au).

The insulating film 23 is formed, for example, continuously on the upper surfaces of the second contact layers 18, the side surfaces of the second contact layers 18, the semiconductor stacked bodies 10, and the buffer layers 13, and the upper surface (surface 12S1) of the first contact layer 12. The insulating film 23 includes, for example, a single layer film such as silicon nitride (SiN) or silicon oxide ($SiO_2$) or a stacked film. The insulating film 23 is provided with the openings 23H (see, for example, FIG. 2D) at predetermined positions on the upper surfaces of the respective second contact layers 18 and the first contact layer 12. Each of the openings 23H is filled with the first electrode 21 or the second electrode 22.

The insulating film 24 is formed, for example, on the whole of the back surface (surface 11S2) of the substrate 11. The insulating film 24 includes, for example, a single layer film such as silicon nitride (SiN) or silicon oxide ($SiO_2$) or a stacked film as with the insulating film 24.

The semiconductor laser 1 according to the present embodiment is a semiconductor laser having a so-called anode common structure in which the plurality of semiconductor stacked bodies 10 and the first electrode 21 provided on the substrate 11 are electrically coupled to each other by the first contact layer 12 including, for example, p-type GaAs.

In a case where predetermined voltages are applied to the first electrode 21 and the second electrode 22, voltages are applied from the first electrode 21 and the second electrode 22 to the semiconductor stacked body 10 in the semiconductor laser 1. This injects an electron to the active layer 15 from the first electrode 21 and injects a hole to the active layer 15 from the second electrode 22. The recombination of the electron and the hole generates light. Light is resonated and amplified between the first light reflecting layer 14 and the second light reflecting layer 16 and laser light L is emitted from the back surface (surface 1152) of the substrate 11.

(1-2. Method of Manufacturing Semiconductor Laser)

Next, a method of manufacturing the semiconductor laser 1 is described with reference to FIGS. 2A to 2D.

First, as illustrated in FIG. 2A, the respective compound semiconductor layers included in the first contact layer 12, the buffer layer 13, the first light reflecting layer 14, the active layer 15, the second light reflecting layer 16, and the second contact layer 18 are formed in this order on the substrate 11, for example, in an epitaxial crystal growth method such as an organometallic vapor growth (Metal Organic Chemical Vapor Deposition: MOCVD) method. In this case, a methyl-based organic metal compound such as trimethylaluminum (TMAl), trimethylgallium (TMGa), or trimethylindium (TMIn) and an arsine ($AsH_3$) gas are used as raw materials of the compound semiconductor, disilane ($Si_2H_6$), for example, is used as a raw material of a donor impurity, and carbon tetrabromide ($CBr_4$), for example, is used as a raw material of an acceptor impurity.

Subsequently, as illustrated in FIG. 2B, a resist film (not illustrated) having a predetermined pattern is formed on the second contact layer 18 and this resist film is then used as a mask to etch the second contact layer 18, the second light reflecting layer 16, the active layer 15, and the first light reflecting layer 14 and form a mesa structure (semiconductor stacked body 10) having a columnar shape. In this case, it is preferable to use, for example, RIE (Reactive Ion Etching) with a Cl-based gas. In the etching of the second contact layer 18, the second light reflecting layer 16, the active layer 15, and the first light reflecting layer 14, the buffer layer 13 functions as an etching stop layer. This makes the etching depth constant in the wafer plane. After that, high-temperature treatment is performed in a water vapor atmosphere to oxidize, for example, an AlGaAs layer having a high aluminum (Al) composition and form an oxidation layer (current confining layer 17) for current confinement. The AlGaAs layer has been stacked in advance at the time of epitaxial growth.

Next, as illustrated in FIG. 2C, the buffer layer 13 is removed by etching to expose the first contact layer 12.

Subsequently, as illustrated in FIG. 2D, the continuous insulating film 23 is formed on the first contact layer 12 from the upper surface of the second contact layer 18 and the insulating film 24 is formed on the back surface (surface 11S2) of the substrate 11. After that, the first electrode 21 and the second electrode 22 are respectively formed on the first contact layer 12 and the second contact layer 18. Each of the insulating films 23 and 24 is formed, for example, in a chemical vapor growth (CVD: Chemical Vapor Deposition) method or an atomic layer deposition (ALD: Atomic Layer Deposition) method. The insulating film 23 is formed to cover the whole of the upper surface (surface 12S1) of the first contact layer 12 exposed by etching from the upper surface of the second contact layer 18. After that, a resist film (not illustrated) having a predetermined pattern is patterned on the insulating film 23 and etching such as RIE is performed to form the opening 23H at a predetermined position. After that, the first electrode 21 and the second electrodes 22 are respectively patterned on the first contact layer 12 and the upper surfaces of the second contact layers 18 by using a lift-off method in which a resist pattern is, for example, used. This completes the semiconductor laser 1 illustrated in FIG. 1.

(1-3. Workings and Effects)

In the semiconductor laser 1 according to the present embodiment, the buffer layer 13 in which any of the carrier concentration, the material composition, and the composition ratio is different from that of the first contact layer 12 is provided between the first contact layer 12 and the semiconductor stacked body 10. This forms the semiconductor stacked body 10 having excellent crystal quality. The following describes this.

A typical surface emitting laser is provided with a contact layer, for example, in the middle of a DBR layer as in the surface-type light emitting element described above. A voltage is applied to a light emitting layer (active layer) through an electrode provided on this contact layer. The contact layer is therefore formed to have a high carrier concentration in general. In a case where the contact layer having a high carrier concentration is formed at a position close to the active layer in the DBR layer in this way, the contact layer may have increased light absorption and the laser oscillation characteristics may be decreased. Meanwhile, in a case where the contact layer has a smaller film thickness to reduce the light absorption of the contact layer, the margin for processing may disappear and the manufacturing yield may be decreased. In addition, a contact layer doped with a high concentration of impurities tends to have deteriorated crystallizability. The crystallizability of a device structure grown on the contact layer may be thus decreased.

In contrast, in the present embodiment, the buffer layer 13 in which any of the carrier concentration, the material composition, and the composition ratio is different from that of the first contact layer 12 is provided on the first contact layer 12. The first light reflecting layer 14, the active layer 15, and the second light reflecting layer 16 included in the device structure (semiconductor stacked body 10) undergo crystal growth through this buffer layer 13. This makes it possible to alleviate the deterioration of the crystallizability of the first contact layer 12 and form the semiconductor stacked body 10 whose crystal quality is maintained.

As described above, in the semiconductor laser 1 according to the present embodiment, the buffer layer 13 in which any of the carrier concentration, the material composition, and the composition ratio is different from that of the first contact layer 12 is provided between the first contact layer 12 and the semiconductor stacked body 10. This makes it possible to maintain the crystal quality of the semiconductor stacked body 10 formed above the first contact layer (e.g., on the buffer layer 13). This makes it possible to increase the reliability.

In addition, in the present embodiment, the buffer layer 13 is provided between the first contact layer 12 and the semiconductor stacked body 10. This increases the design freedom of the film thickness of the first contact layer. This makes it possible to reduce the light absorption of the first contact layer while suppressing a decreasing process margin. This makes it possible to increase the oscillation characteristics of the laser light L emitted from the back surface (surface 11S2) of the substrate 11 while maintaining the manufacturing yield.

2. Application Example

The present technology is applicable to a variety of electronic apparatuses including a semiconductor laser. For example, the present technology is applicable to a light source included in a portable electronic apparatus such as a smartphone, a light source of each of a variety of sensing apparatuses that each sense a shape, an operation, and the like, or the like.

FIG. 3 is a block diagram illustrating a schematic configuration of a distance measurement system (distance measurement system 200) in which a lighting apparatus 100 including the semiconductor laser 1 described above is used. The distance measurement system 200 measures distance in the ToF method. The distance measurement system 200 includes, for example, the lighting apparatus 100, a light receiving unit 210, a control unit 220, and a distance measurement unit 230.

The lighting apparatus 100 includes, for example, the semiconductor laser 1 illustrated in FIG. 1 or the like as a light source. The lighting apparatus 100 generates illumination light, for example, in synchronization with a light emission control signal CLKp of a rectangular wave. In addition, the light emission control signal CLKp is not limited to the rectangular wave as long as it is a periodic signal. For example, the light emission control signal CLKp may be a sine wave.

The light receiving unit 210 receives the reflected light that is reflected from an irradiation target 300 and detects, whenever a period of a vertical synchronization signal VSYNC elapses, the amount of light received within the period. For example, a periodic signal of 60 hertz (Hz) is used as the vertical synchronization signal VSYNC. In addition, in the light receiving unit 210, a plurality of pixel circuits is disposed in a two-dimensional lattice shape. The light receiving unit 210 supplies the image data (frame) corresponding to the amount of light received in these pixel circuits to the distance measurement unit 230. It is to be noted that the frequency of the vertical synchronization signal VSYNC is not limited to 60 hertz (Hz), but may be 30 hertz (Hz) or 120 hertz (Hz).

The control unit 220 controls the lighting apparatus 100. The control unit 220 generates the light emission control signal CLKp and supplies the lighting apparatus 100 and the light receiving unit 210 with the light emission control signal CLKp. The frequency of the light emission control signal CLKp is, for example, 20 megahertz (MHz). It is to be noted that the frequency of the light emission control signal CLKp is not limited to 20 megahertz (MHz), but may be, for example, 5 megahertz (MHz).

The distance measurement unit 230 measures the distance to the irradiation target 300 in the ToF method on the basis of the image data. This distance measurement unit 230 measures the distance for each of the pixel circuits and generates a depth map that indicates the distance to the object for each of the pixels as a gradation value. This depth map is used, for example, for image processing of performing a blurring process to the degree corresponding to the distance, autofocus (AF) processing of determining the focused focal point of a focus lens in accordance with the distance, or the like.

Although the present technology has been described above with reference to the embodiment and the application example, the present technology is not limited to the embodiment and the like described above. A variety of modifications are possible. For example, the layer configuration of the semiconductor laser 1 described in the embodiment described above is an example and another layer may be further included. In addition, the materials of each of the layers are also examples. Those described above are not limitative.

It is to be noted that the effects described herein are merely illustrative and non-limiting. In addition, other effects may be provided.

It is to be noted that the present technology may be configured as below. According to the present technology having the following configurations, the buffer layer in which at least any of the carrier concentration, the material composition, and the composition ratio is different from that of the first contact layer 12 is provided between the first contact layer and the semiconductor stacked body. This makes it possible to form the semiconductor stacked body having excellent crystal quality. This makes it possible to increase the reliability.

(1)

A light emitting device including:

a substrate having a first surface and a second surface that are opposed to each other;

a first contact layer that is stacked on the first surface of the substrate;

a buffer layer in which at least any of a carrier concentration, a material composition, and a composition ratio is different from that of the first contact layer, the buffer layer being stacked on the first contact layer; and a semiconductor stacked body that is stacked above the first surface of the substrate with the first contact layer and the buffer layer interposed in between, the semiconductor stacked body having a light emitting region configured to emit laser light.

(2)

The light emitting device according to (1), in which a carrier concentration of the buffer layer is less than $1\times10^{19}$ $cm^{-3}$.

(3)

The light emitting device according to (1) or (2), in which a carrier concentration of the first contact layer is $1\times10^{19}$ $cm^{-3}$ or more.

(4)

The light emitting device according to any one of (1) to (3), in which the buffer layer has a single layer structure or a stacked structure including at least any of a GaAs layer, an AlAs layer, an AlGaAs layer, an InGaAs layer, an AlGaInAs layer, a GaInP layer, and a AlGaInP layer.

(5)

The light emitting device according to any one of (1) to (4), in which the substrate includes a semi-insulating substrate having a p-type or n-type carrier concentration of $5\times10^{17}$ $cm^{-3}$ or less.

(6)

The light emitting device according to any one of (1) to (5), in which the semiconductor stacked body has a first light reflecting layer, an active layer, and a second light reflecting layer stacked in order from the substrate side.

(7)

The light emitting device according to (6), in which the semiconductor stacked body further includes a current confining layer between the first light reflecting layer and the active layer, the current confining layer having a current injection region.

(8)

The light emitting device according to (6) or (7), in which the first contact layer, the buffer layer, and the first light reflecting layer each include a p-type impurity.

(9)

The light emitting device according to any one of (6) to (8), in which a second contact layer is further stacked on the second light reflecting layer of the semiconductor stacked body.

(10)

The light emitting device according to any one of (1) to (9), in which

- a plurality of the semiconductor stacked bodies is provided on the first surface of the substrate, and
- the first contact layer is formed as a layer common to a plurality of the semiconductor stacked bodies.

(11)

The light emitting device according to (10), further including:

- a first electrode that is provided on a surface of the semiconductor stacked body opposite to the substrate, the first electrode being provided to be configured to apply a predetermined voltage to the semiconductor stacked body in the light emitting region; and
- a second electrode that is provided on the first contact layer.

(12)

The light emitting device according to any one of (1) to (11), in which the laser light is emitted from the second surface of the substrate.

The present application claims the priority on the basis of Japanese Patent Application No. 2020-019567 filed on Feb. 7, 2020 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light emitting device comprising:

- a substrate having a first surface and a second surface that are opposed to each other;
- a first contact layer that is stacked directly on the first surface of the substrate;
- a buffer layer with a thickness of between 100 nanometers (nm) and 1000 nm in which a carrier concentration is different from that of the first contact layer, the buffer layer being stacked on the first contact layer; and
- a semiconductor stacked body that is stacked above the first surface of the substrate with the first contact layer and the buffer layer interposed in between, the semiconductor stacked body having a light emitting region configured to emit laser light,
- wherein the buffer layer includes at least any of a GaAs layer, an AlAs layer, an AlGaAs layer, an InGaAs layer, an AlGaInAs layer, a GaInP layer, and a AlGaInP layer and has a single layer structure or a stacked structure.

2. The light emitting device according to claim 1, wherein a carrier concentration of the buffer layer is less than $1\times10^{19}$ $cm^{-3}$.

3. The light emitting device according to claim 1, wherein a carrier concentration of the first contact layer is $1\times10^{19}$ $cm^{-3}$ or more.

4. The light emitting device according to claim 1, wherein the substrate includes a semi-insulating substrate having a p-type or n-type carrier concentration of $5\times10^{17}$ $cm^{-3}$ or less.

5. The light emitting device according to claim 1, wherein the semiconductor stacked body has a first light reflecting layer, an active layer, and a second light reflecting layer stacked in order from the substrate side.

6. The light emitting device according to claim 5, wherein the semiconductor stacked body further includes a current confining layer between the first light reflecting layer and the active layer, the current confining layer having a current injection region.

7. The light emitting device according to claim 5, wherein the first contact layer, the buffer layer, and the first light reflecting layer each include a p-type impurity.

8. The light emitting device according to claim 5, wherein a second contact layer is further stacked on the second light reflecting layer of the semiconductor stacked body.

9. The light emitting device according to claim 1, wherein

- a plurality of the semiconductor stacked bodies is provided on the first surface of the substrate, and
- the first contact layer is formed as a layer common to a plurality of the semiconductor stacked bodies.

10. The light emitting device according to claim 9, further comprising:

- a first electrode that is provided on a surface of the semiconductor stacked body opposite to the substrate, the first electrode being provided to be configured to apply a predetermined voltage to the semiconductor stacked body in the light emitting region; and
- a second electrode that is provided on the first contact layer.

11. The light emitting device according to claim 1, wherein the laser light is emitted from the second surface of the substrate.

12. The light emitting device according to claim 1, wherein the light emitting region is configured to emit infrared laser light.

13. A light emitting device comprising:

a substrate having a first surface and a second surface that are opposed to each other;

a first contact layer that is stacked directly on the first surface of the substrate;

a buffer layer with a thickness of between 100 nanometers (nm) and 1000 nm in which a carrier concentration is different from that of the first contact layer, the buffer layer being stacked on the first contact layer; and a semiconductor stacked body that is stacked above the first surface of the substrate with the first contact layer and the buffer layer interposed in between, the semiconductor stacked body having a light emitting region configured to emit laser light, wherein the light emitting region is configured to emit infrared laser light.

14. The light emitting device according to claim 13, wherein a carrier concentration of the buffer layer is less than $1\times10^{19}$ $cm^{-3}$.

15. The light emitting device according to claim 13, wherein a carrier concentration of the first contact layer is $1\times10^{19}$ $cm^{-3}$ or more.

16. The light emitting device according to claim 13, wherein the substrate includes a semi-insulating substrate having a p-type or n-type carrier concentration of $5\times10^{17}$ $cm^{-3}$ or less.

17. The light emitting device according to claim 13, wherein the semiconductor stacked body has a first light reflecting layer, an active layer, and a second light reflecting layer stacked in order from the substrate side.

18. The light emitting device according to claim 13, wherein a plurality of the semiconductor stacked bodies is provided on the first surface of the substrate, and the first contact layer is formed as a layer common to a plurality of the semiconductor stacked bodies.

19. The light emitting device according to claim 18, further comprising:

a first electrode that is provided on a surface of the semiconductor stacked body opposite to the substrate, the first electrode being provided to be configured to apply a predetermined voltage to the semiconductor stacked body in the light emitting region; and a second electrode that is provided on the first contact layer.

20. The light emitting device according to claim 13, wherein the laser light is emitted from the second surface of the substrate.

* * * * *